(12) United States Patent
Tsutsui

(10) Patent No.: US 6,198,702 B1
(45) Date of Patent: Mar. 6, 2001

(54) INFORMATION PROVIDING AND COLLECTING APPARATUS AND RECORDING MEDIUM

(75) Inventor: Kyoya Tsutsui, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/317,411

(22) Filed: May 24, 1999

Related U.S. Application Data

(62) Division of application No. 08/931,262, filed on Sep. 16, 1997, which is a division of application No. 08/735,209, filed on Oct. 22, 1996, now Pat. No. 5,724,546, which is a continuation of application No. 08/191,117, filed on Feb. 3, 1994, now abandoned.

(30) Foreign Application Priority Data

Feb. 27, 1993 (JP) .................................................. 5-063345

(51) Int. Cl.[7] ...................................................... H04H 9/00
(52) U.S. Cl. ................................................................. 369/7
(58) Field of Search ............................. 369/7, 6; 455/66, 455/67.1, 575, 9

(56) References Cited

U.S. PATENT DOCUMENTS

| | | | | |
|---|---|---|---|---|
| 4,268,724 | * | 5/1981 | Hubbard | 369/7 |
| 4,408,309 | * | 10/1983 | Kiesling et al. | 369/7 |
| 5,345,430 | * | 9/1994 | Moe | 369/7 |
| 5,619,570 | * | 4/1997 | Tsutsui | 380/4 |
| 5,633,837 | * | 5/1997 | Gantt | 369/7 |
| 5,671,195 | * | 9/1997 | Lee | 369/7 |
| 5,710,978 | * | 1/1998 | Swift | 455/67.1 |

* cited by examiner

Primary Examiner—Tan Dinh
(74) Attorney, Agent, or Firm—Ronald P. Kananen; Rader, Fishman & Grauer

(57) ABSTRACT

An information providing and collecting apparatus includes an information dividing circuit and an adding means. The information dividing circuit divides an input signal into information segments based on a break in information being carried by the input signal, or a marker in the input signal generated by a user indicating an end of an information segment. The adding means adds an information division signal in advance of each of the information segments.

4 Claims, 9 Drawing Sheets

INFORMATION PROVIDING AND COLLECTING APPARATUS AND RECORDING MEDIUM

This application is a Divisional application of Ser. No. 08/931,262, filed Sep. 16, 1997, still pending; Which is a Divisional application of Ser. No. 08/735,209, filed Oct. 22, 1996, and now is U.S. Pat. No. 5,724,546; Which is a Continuation application of Ser. No. 08/191,117, filed Feb. 3, 1994, abandoned.

BACKGROUND OF THE INVENTION

1. Field of the Invention

This invention relates to an information providing and collecting apparatus for efficiently collecting or preserving information, e.g., news, etc.

2. Description of the Prior Art

The applicant of this application has already proposed, in the specification and the drawings of the U.S. Ser. No. 08/131943, filed on Oct. 8, 1993, as an apparatus for efficiently providing, collecting or preserving information, e.g., news, etc., an information providing and collecting apparatus adapted to transfer information such as speech (sound), etc. from an information providing device to an information recording device (recorder) provided with a recording medium comprised of a semiconductor memory, etc., thus to collect such information.

In accordance with the information providing and collecting apparatus described in the specification and the drawings which have been already proposed, a user of the information recorder reproduces such information, thereby making it possible to rapidly obtain information, e.g., news, etc.

Meanwhile, a recorder as described above is adapted so that once new information is taken thereinto, previous information disappears because it is repetitively used. In this case, it is sufficient to copy the content (the above-mentioned previous information) of a recording medium onto another recording medium, e.g., a magneto-optical disk, etc. before new information is recorded.

However, ordinarily, in the case of information such as news mentioned above, information that a user wishes to preserve for the future is limited. If all of this information is preserved on any other recording medium, that recording medium is filled with unnecessary information in capacity at once. In addition, in the case where there occurs the necessity of making reference to such information later, a quantity of information to be retrieved would be increased. As a result, it might take a long time until necessary information is obtained.

OBJECT AND SUMMARY OF THE INVENTION

With the above in view, an object of this invention is to provide an information providing and collecting apparatus which can rapidly obtain and reproduce information, e.g., news, etc., and which can preserve only a necessary portion of such information, and retrieve or reproduce the necessary information with ease in the future.

A first information providing and collecting apparatus of this invention has been proposed in order to attain the above-desired object. Namely, this apparatus comprises a selector means for selecting a specific portion of information recorded in a primary recording medium, and is adapted to record select information indicating the specific portion of the information from the selector means into the primary recording medium, and to transfer the information of the specific portion specified by the select information to a secondary recording medium.

Further, a second information providing and collecting apparatus of this invention comprises reproducing means for reproducing information recorded in a primary recording medium, selector means for selecting a portion to be transferred to a secondary recording medium of the information recorded in the primary recording medium, and recording means for recording the select information specified by the selector means into the primary recording medium.

In addition, a third information providing and collecting apparatus includes recording/reproducing means for recording, onto a secondary recording medium, only a portion specified by select information indicating a specific portion of recorded information in a primary recording medium where information including that select information is recorded.

The third information providing and collecting apparatus comprises reproducing means for information recorded on the secondary recording medium, and further comprises retrieving means for retrieving the content of the primary recording medium on the basis of information recorded on the secondary recording medium.

In the above-mentioned first, second and third information providing and collecting apparatuses, audio information, picture information and character information are included in information recorded in the primary recording medium. This primary recording medium is comprised of a semiconductor memory.

Further, in the above-mentioned first and second information providing and collecting apparatuses, information recorded in the primary recording medium is information recorded while being divided in point of time by information dividing means. This information dividing means detects a specific signal to carry out division of information. It is to be noted that selection of the specific portion of information is made by carrying out inputting to the selector means during reproduction of any portion of the information. In addition, at the time of transfer to the secondary recording medium, date information is recorded onto the secondary recording medium.

A fourth information providing and collecting apparatus of this invention comprises signal input means adapted so that a signal is inputted thereto, signal converting means for converting that input signal, information dividing means for dividing output information of the signal converting means, and recording means for recording output information of the signal converting means and divided information. Here, the information dividing means serves to carry out the division in accordance with detection of specific information from output information of the signal converting means. Additionally, this apparatus comprises radio signal receiving means as the signal input means.

Further, the first to fourth information providing and collecting apparatuses of this invention comprise clock means so that date information can be recorded.

A fifth information providing and collecting apparatus of this invention comprises adding means for adding an information division signal to a signal outputted. Here, the information division signal is a signal of a specific frequency. By using this signal, it is possible to transmit information by radio or by wire.

The recording medium of this invention is a recording medium in which information including transfer indication information to a secondary recording medium is recorded. Into the recording medium of this invention, information including audio information, information including picture information, information including character information, and information including date information are recorded. This recording medium is preferably comprised of a semiconductor memory.

In accordance with the information providing and collecting apparatus, user of this apparatus a operates means for selecting information required for preservation at the time of reproducing information, or the like to transfer only information specified by the select information to the recording medium, thereby making it possible to easily preserve necessary information.

Namely, in accordance with this invention, a user of the information recording/reproducing device (portable recorder) of the information providing and collecting apparatus operates selector means for selecting information required to be preserved at the time of reproduction of information, or the like to transfer only information specified by the select information to the recording medium, thereby making it possible to easily preserve necessary information. Accordingly, it is possible to rapidly obtain or reproduce information such as news, etc., and to easily record only the necessary portion thereof onto the secondary recording medium. Thus, it is possible to retrieve or reproduce necessary information with ease another day.

DESCRIPTION OF THE PREFERRED EMBODIMENTS

Preferred embodiments of this invention will now be described with reference to the attached drawings.

Figure 1:
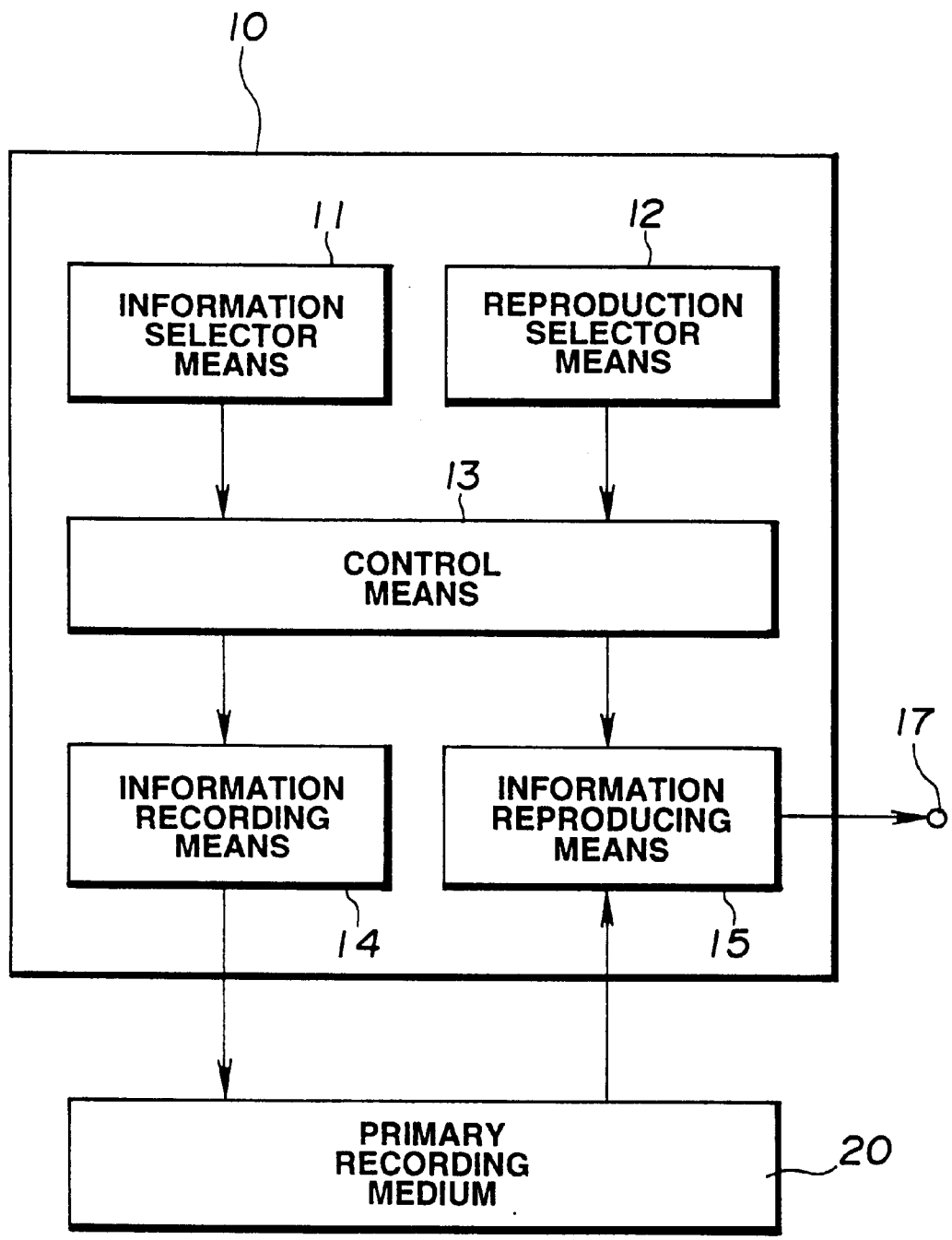
FIG. 1 is a circuit diagram showing, in a block form, the outline of the configuration of an information recording/reproducing device of an information providing and collecting apparatus according to a first embodiment of this invention.

FIG. 1 shows the configuration of an information recording/reproducing device of an information providing and collecting apparatus of a first embodiment. Namely, this information recording/reproducing device 10 comprises, as shown in FIG. 1, information recording means 14 for recording information into a primary recording medium 20, information reproducing means 15 for reproducing information recorded in the primary recording medium 20, and information selector means 11 and reproduction selector means 12 as selector means for selecting a specific portion of information recorded in the primary recording medium 20. The information recording means 14 is controlled by control means 13 so as to record select information indicating a specific portion of the information from the information selector means 11 into the primary recording medium 20. Further, the information reproducing means 15 is controlled by the control means 13 so as to reproduce the information of the specific portion specified by the select information from the primary recording medium 20 to transfer the reproduced information to a secondary recording medium which will be described later.

In FIG. 1, user can selectively reproduce the content of the primary recording medium 20 by using the reproduction selector means 12. Although the content of information in the primary recording medium 20 is not particularly limited, explanation will be given on the premise that, in this embodiment, e.g., news information is recorded as audio information and text information, and key word information is added thereto.

Select information from the reproduction selector means 12 based on selection by user is sent to information reproducing means 15 through control means 13. This information reproducing means 15 selects an arbitrary audio information from the primary recording medium 20 on the basis of select information from the reproduction selector means 12 to reproduce it. The audio information thus selected and reproduced is sent to sound generating means, e.g., earphone or speaker, etc. through terminal 17.

A user of the information recording/reproducing device 10 specifies, through the information selector means 11, a portion that he wishes to obtain a backup copy for future use while listening to sound from the sound generating means. The specified information from the information selector means 11 is recorded into the primary recording medium 20 as flag information through control means 13 and information recording means 14, An example of the content recorded in the primary recording medium 20 is shown in FIG. 2.

Figure 2:
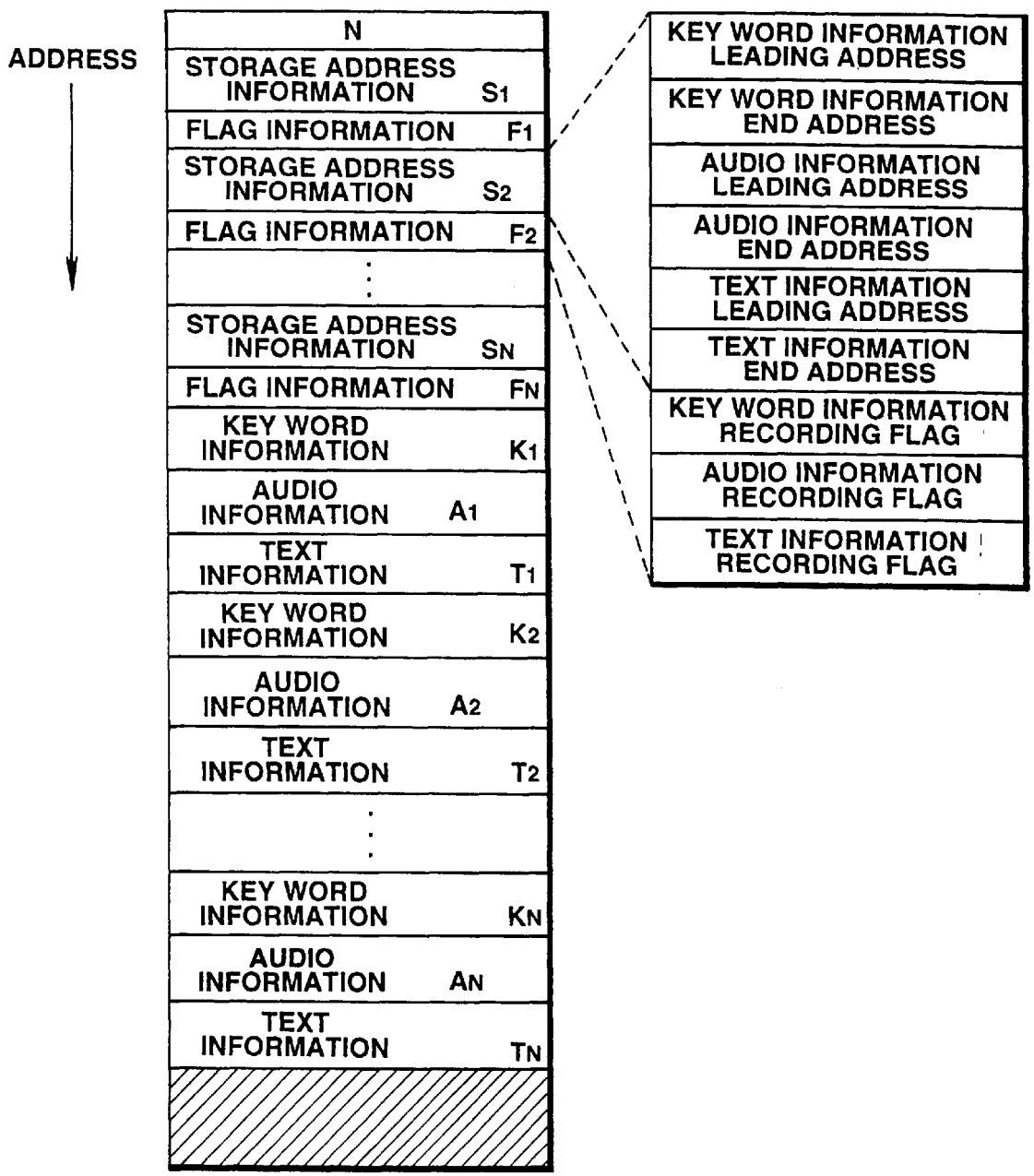
FIG. 2 is a view for explaining the content to be recorded into a primary recording medium used in the device shown in FIG. 1.

In FIG. 2, at the first address of the primary recording medium 20, the number of information indicating how many information are recorded in the recording medium 20 is recorded.

In this embodiment, N number of information are recorded.

At addresses subsequent thereto, storage address information $S_1$~$S_N$ indicating memory location of N sets of information, and flag information $F_1$~$F_N$ indicating whether or not these information should be recorded onto the secondary recording medium are recorded. Subsequently to those addresses, N sets of information of, e.g., key word information $K_1$~$K_N$, audio information $A_1$~$A_N$, and text information $T_1$~$T_N$ are recorded.

The above-mentioned storage address information S consists of, in a practical sense, key word information leading address, key word information end information, audio information leading address, audio information end address, text information leading address, and text information end address. Further, flag information F consists of, in a practical sense, a key word information recording flag, an audio information recording flag, and a text information recording flag.

The flag information F is determined so that when the value of the flag information F is "1", information corresponding thereto is recorded onto the secondary recording medium, while when that value is not "1" (is "0"), information corresponding thereto is not recorded onto the secondary recording medium. For example, at the time point when information is transferred from an information providing device which will be described to the primary recording medium 20, it is sufficient to set the flag information F to "0". The flag information $F_1$~$F_N$ can be provided respectively with respect to key word information $K_1$~$K_N$, audio information $A_1$~$A_N$, and text information $T_1$~$T_N$. For example, a user of the information recording/reproducing device 10 can give an instruction to record, onto a secondary recording medium which will be described later, only text information T corresponding to speech based on audio information A while listening to that speech.

It is to be noted that there may be employed as a matter of course a scheme of recording, e.g., date information, etc. in which this information is transferred from the information providing device which will be described later in addition to flag information F or storage address information S to permit this information onto the secondary recording medium, thus to utilize date information at the time of reproduction or retrieval in an information secondary recording/reproducing device which will be described below.

Figure 3:
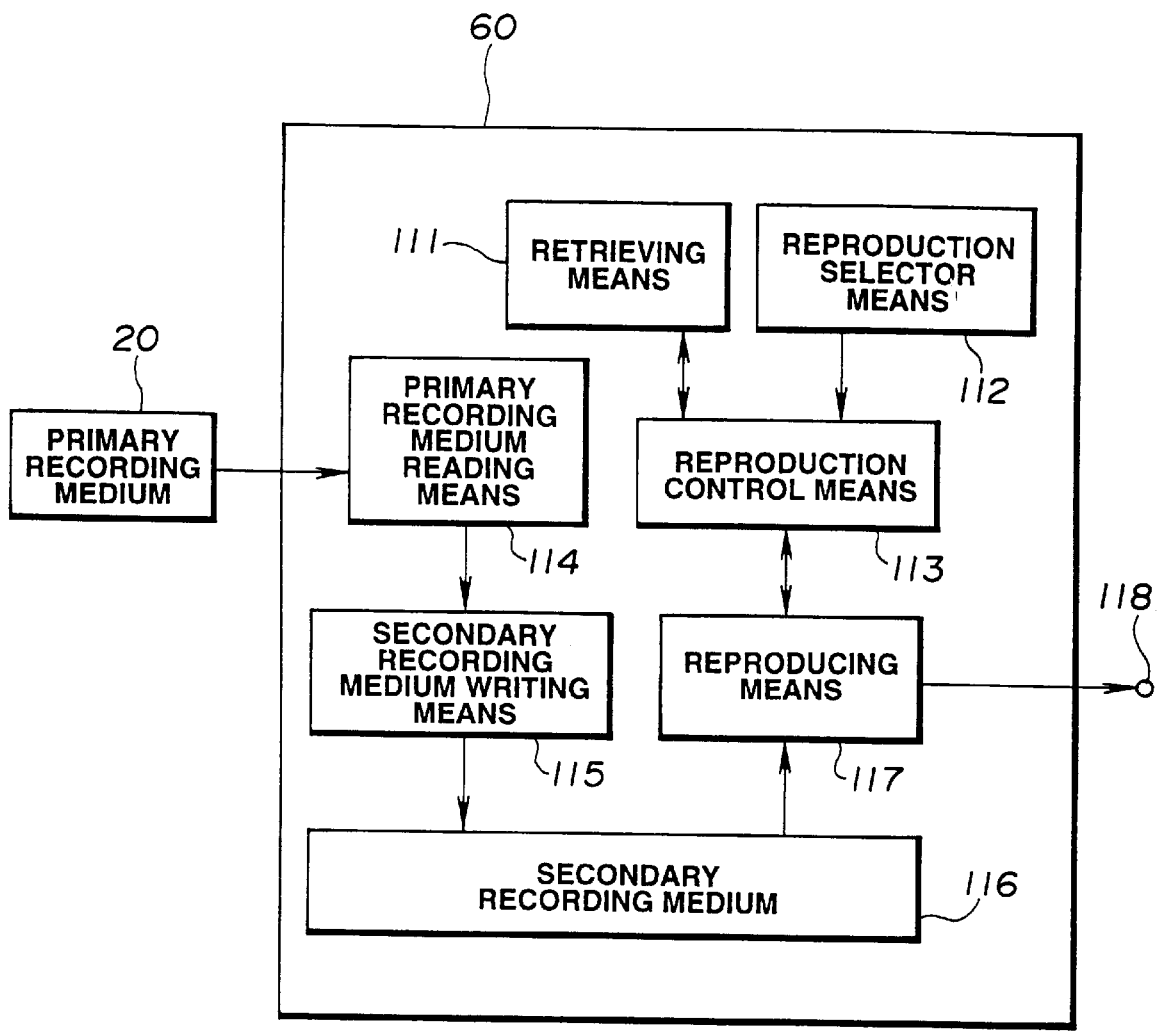
FIG. 3 is a circuit diagram showing, in a block form, the outline of the configuration of an information secondary recording/reproducing device applied to the information providing and collecting apparatus of the first embodiment.

FIG. 3 shows an actual configuration of information secondary recording/reproducing device 60 applied to the information providing and collecting apparatus according to the first embodiment of this invention.

In FIG. 3, primary recording medium reading means 114 reads the content of the primary recording medium 20 to send, to secondary recording medium writing means 115, only information specified to be recorded onto secondary recording medium 116 by the flag information F. This secondary recording medium writing means 115 records this information onto the secondary recording medium 116 along with storage address information S with respect to the secondary recording medium 116.

It is to be noted that, e.g., a magneto-optical disk may be used as the secondary recording medium 116. While, in this embodiment, this secondary recording medium 116 is disposed within the information secondary recording/reproducing device 60, that medium may be detachably disposed.

The information recorded onto the secondary recording medium 116 in this way is reproduced by reproducing means 117 under control of reproduction control means 113 on the basis of reproduction indication information given through retrieving means 111 or reproduction selector means 112 by the user (reproduction indication information from the retrieving means 111 or reproduction indication information from reproduction selector means 112). Thus, it is possible to readily reproduce a necessary portion of information recorded on the secondary recording medium 116. Reproduced information from the reproducing means 117 is outputted from terminal 118. An output from the terminal 118 is sent to sound generating means, e.g., a speaker, etc.

While, in the above-described embodiment, e.g., audio information, e.g., news information, etc. is exemplified as the content in the primary recording medium 20, the content of such information may be not only audio information but also, e.g., various information including, e.g., text information or video information, etc. along with audio information. Namely, the content of information in the primary recording medium is not particularly limited.

As stated above, in the case where reproduced information obtained from the recording medium is, e.g., text information or video information, it is possible to display it on the display means, e.g., a liquid crystal display, etc. On the other hand, in the case where reproduced information is, e.g., audio information, it is possible to output it to the sound generating means, etc. in a manner previously described.

Further, the kind of primary recording medium, 20 is not particularly limited in this invention, but various recording media may be used. Especially, it is preferable to use a semiconductor memory which can copy information at a high speed, is easy to be accessed at random, and is excellent in portability.

Figure 4:
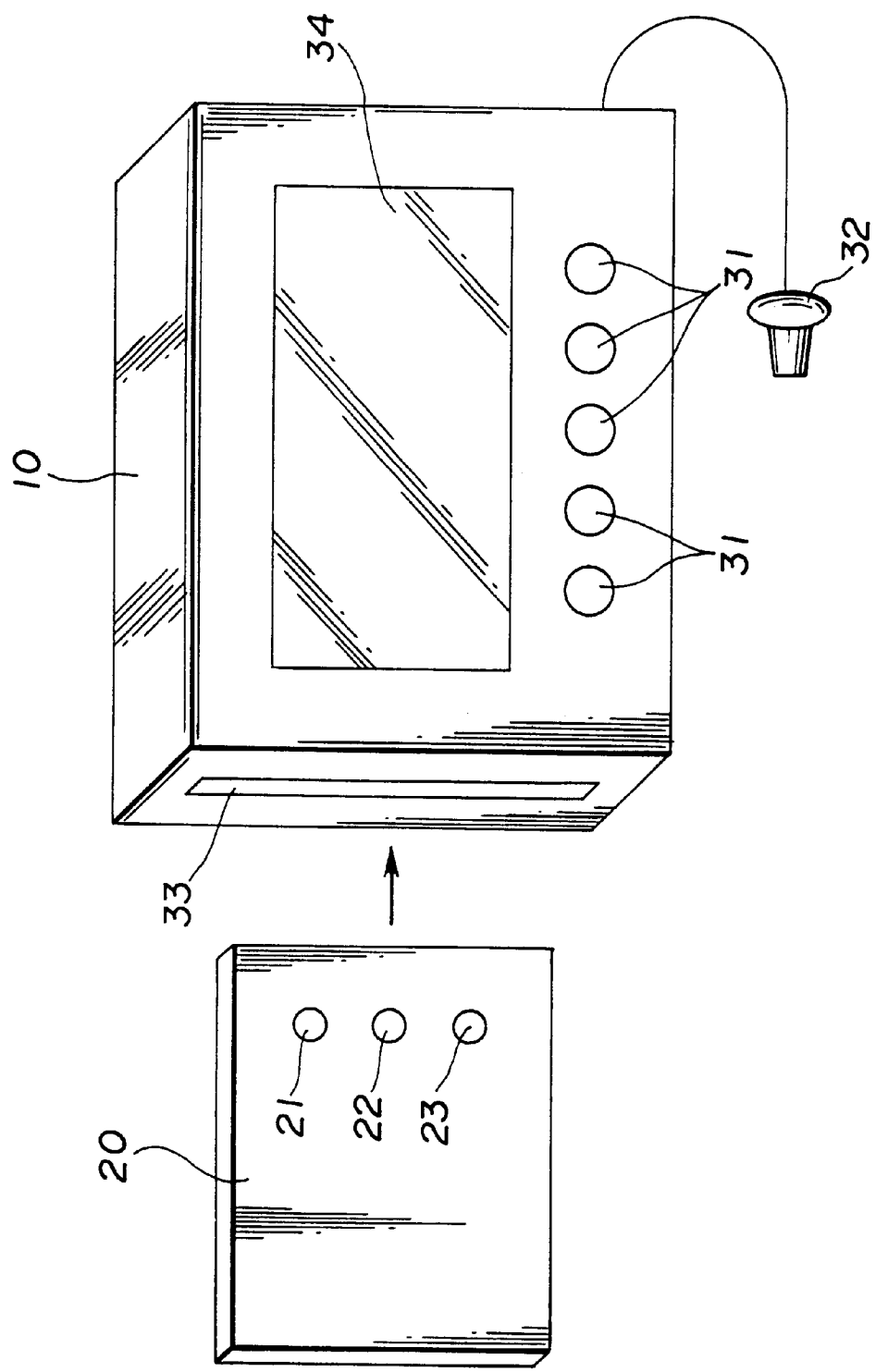
FIG. 4 is a schematic perspective view showing appearance of the information recording/reproducing device shown in FIG. 1.
Figure 5:
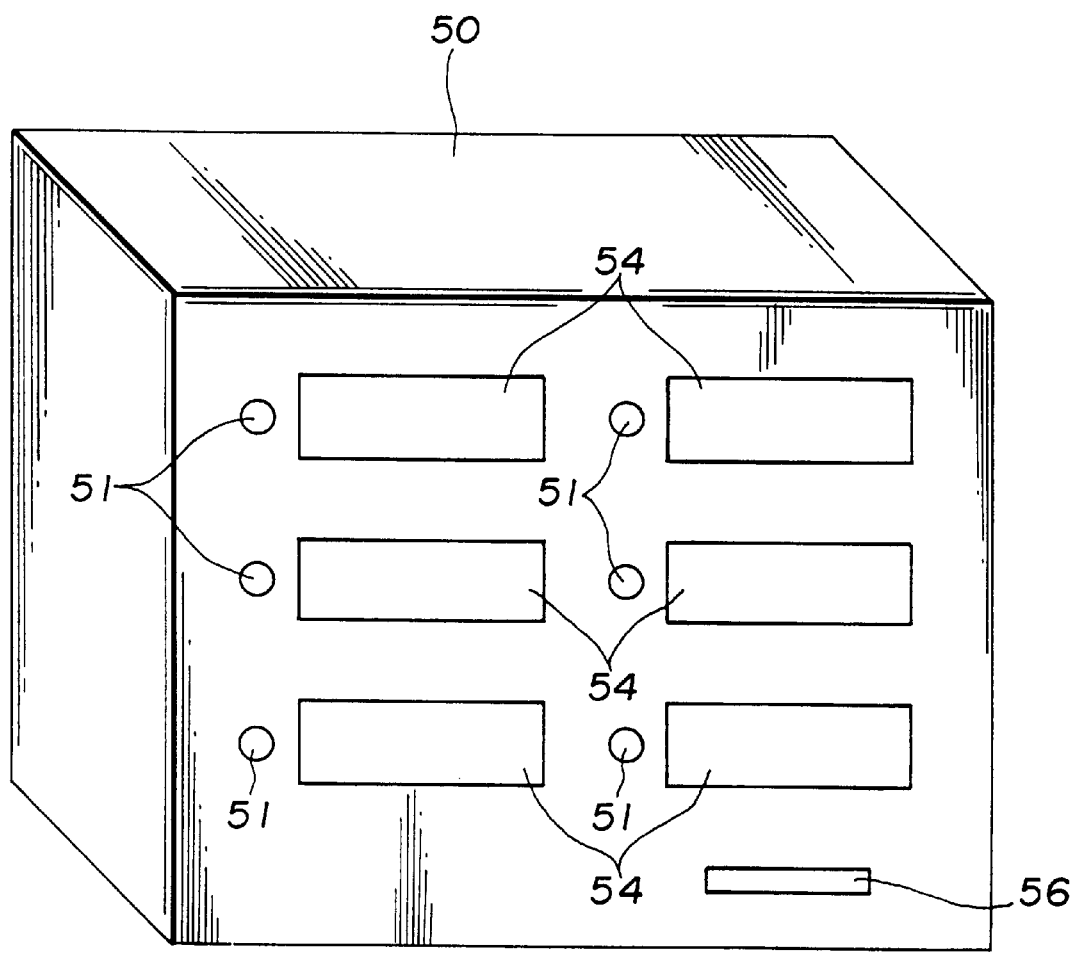
FIG. 5 is a schematic perspective view showing appearance of an information providing device of the information providing and collecting apparatus of the first embodiment.

FIG. 4 shows the outline of appearance of information recording/reproducing device 10 and primary recording medium 20 of the above-described first embodiment. Appearance of an information providing device 50 of the information providing and collecting apparatus of this embodiment is shown in FIG. 5. In FIGS. 4 and 5, the case where audio information, text information or video information, etc. is handled as the content of information in the recording medium is taken as an example.

In FIG. 4, an information providing device connection terminal 21 is provided at the primary recording medium 20 of this embodiment. Accordingly, it is possible to make copying of information from the information providing device 50 of FIG. 5 to the primary recording medium 20.

Further, the information recording/reproducing device 10 of FIG. 4 is provided with display means 34, e.g., liquid crystal display, etc., and selector means 31 having both functions of reproduction selector means 12 and information selector means 11 of FIG. 1, which is comprised of, e.g., a push button switch or a touch switch, etc. On the display means 34, the content of information recorded in the information recording/reproducing device 10 can be displayed. As stated above, in the device 10 of FIG. 4, in the case where reproduced information obtained from the primary recording medium 20 is, e.g., text information or video information, that information is displayed on the display means 34, and in the case where reproduced information is, e.g., audio information, that information is outputted to an earphone 32, etc.

User of the information recording/reproducing device 10 can selectively reproduce necessary information by using selector means 31 such as push button switch, etc. on the basis of information content displayed on the display means 34 or sound from earphone 32.

It is to be noted that although not illustrated in FIG. 4, it is a matter of course that a speaker may be equipped in place of the earphone 32, or in addition to earphone 32. In that case, a reproduced result of the audio information may be outputted to the speaker. In addition, reproduced information may be outputted to an external CRT (Cathode Ray Tube) or an external speaker, etc. by using external terminals although not illustrated in FIG. 4.

While, in the example of FIG. 4, the primary recording medium 20 is detachably provided, it may be fixedly provided within the information recording/reproducing device 10.

FIG. 5 shows the outline of appearance of an information providing device of the information providing and collecting apparatus according to the first embodiment of this invention.

In FIG. 5, a recording medium is provided within the information providing device 50. Information is recorded in the recording medium. Although omitted in FIG. 5, it is preferable that information recorded in the recording medium is transmitted by information transmitting means by wire or radio. It is a matter of course that a recorded recording medium is adapted to be inserted into the information providing device 50.

In the information providing device 50 of FIG. 5, there are provided a plurality of display means 54 for displaying the content of information recorded or price, etc., and output selector means 51 for selecting which information is outputted from the information providing device 50 in correspondence with respective display means 54. Thus, a person who wishes to obtain information (a user) can select desired information. Acquisition of information is realized by inserting primary recording medium 20 that user has into a pocket 56 for insertion or ejection of the information providing device 50 to receive a copy thereof.

Figure 6:
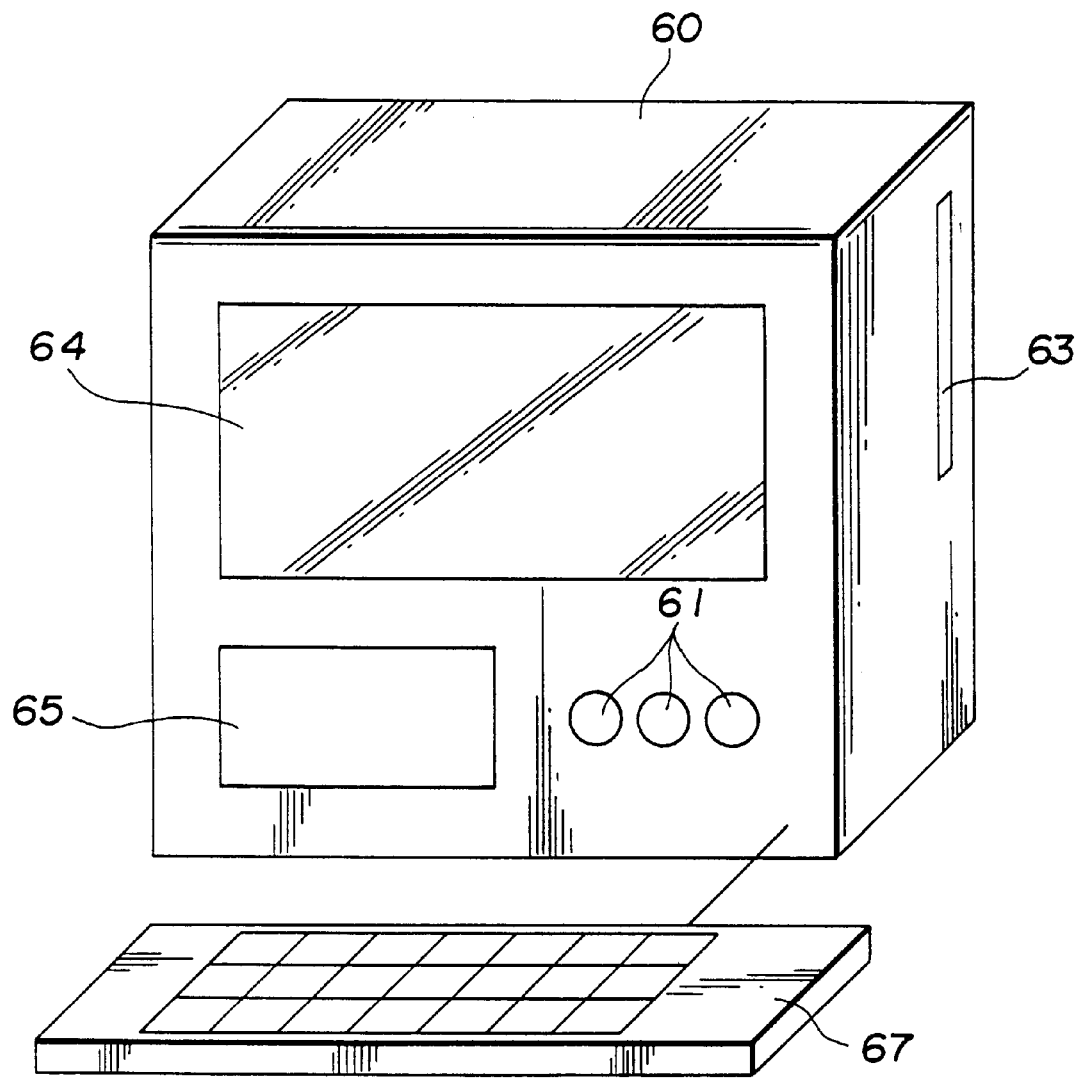
FIG. 6 is a schematic perspective view showing appearance of the information secondary recording/reproducing device shown in FIG. 3.

FIG. 6 shows an actual appearance of the above-mentioned information secondary recording/reproducing device 60 of FIG. 3.

When primary recording medium 20 of FIG. 4 is inserted into a primary recording medium insertion pocket 63 of the information secondary recording/reproducing device 60, it is possible to transfer the content of information recorded in the primary recording medium 20 to secondary recording medium (secondary recording medium 116 of FIG. 3) provided therewithin.

Also in the information secondary recording/reproducing device 60, display means 64 and/or speaker 65 similar to the above are provided. Thus, it is possible to output, to the display means 64 or the speaker 65, information based on selection by selector means 61 (having both functions of reproduction selector means 112 and retrieving means 111 of FIG. 3).

It is to be noted that while, in the example of FIG. 6, the secondary recording medium (116) is fixedly provided within the information secondary recording/reproducing device 60, it is a matter of course that such medium may be detachably provided.

As stated above, the content recorded on the secondary recording medium (116) may be repeatedly reproduced in future, or necessary portion thereof may be retrieved and reproduced.

Figure 7:
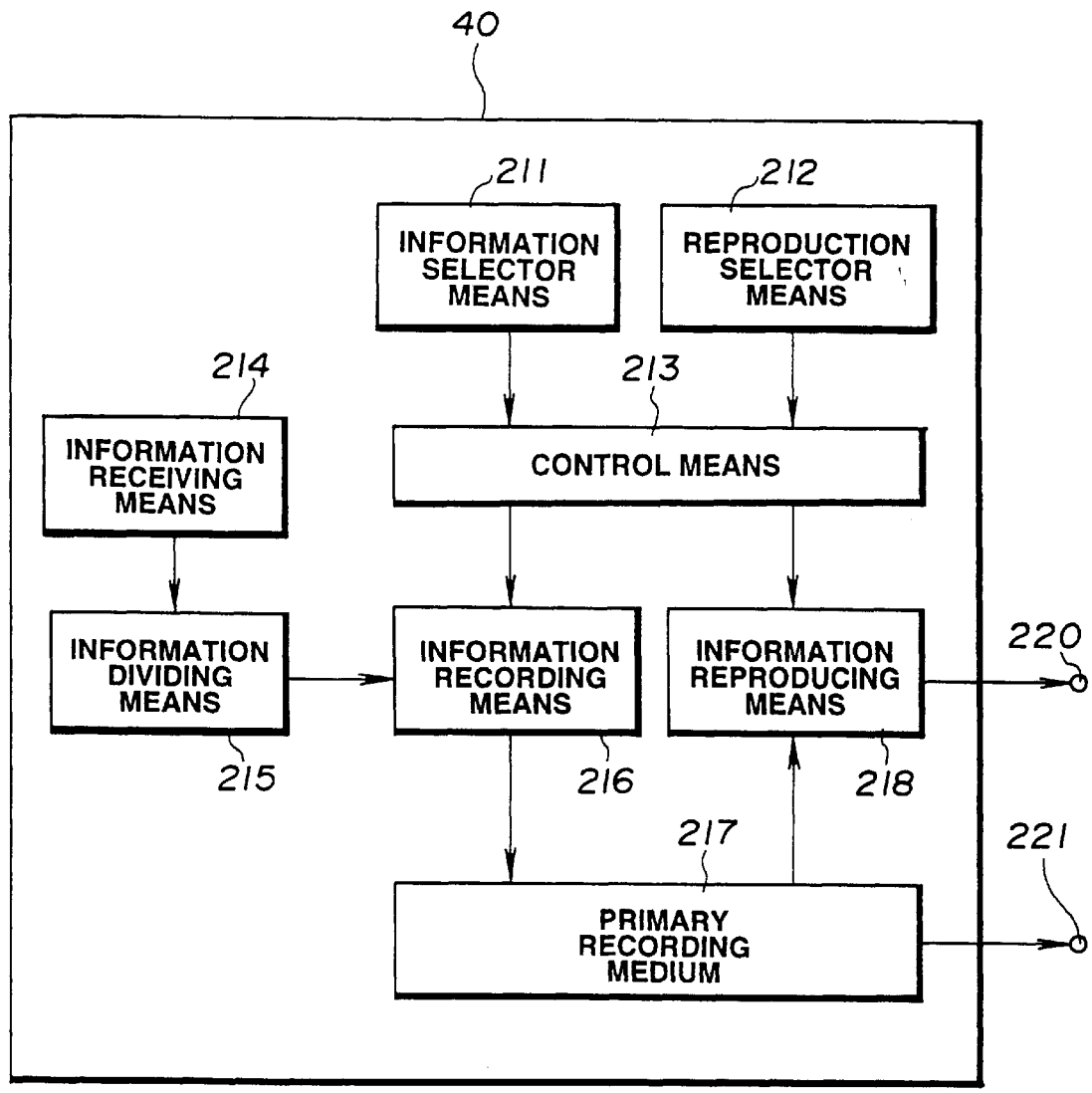
FIG. 7 is a circuit diagram showing, in a block form, the outline of the configuration of an information recording/reproducing device of an information providing and collecting apparatus of a second embodiment.

The outline of the configuration of information recording/reproducing device 40 of an information providing and collecting apparatus according to a second embodiment of this invention is shown in FIG. 7.

In FIG. 7, e.g., audio information received from the external through, e.g., information receiving means 214 is sent to information dividing means 215. This information dividing means 215 divides audio information sent thereto in point of time on the basis of the content of audio information to record it into a primary recording medium 217 through information recording means 216 every divided audio information. Division of audio information in point of time resultantly leads to generation of storage address information in the case where recording into the primary recording medium 217 is carried out. The manner of recording into the primary recording medium 217 is shown in FIG. 8.

Figure 8:
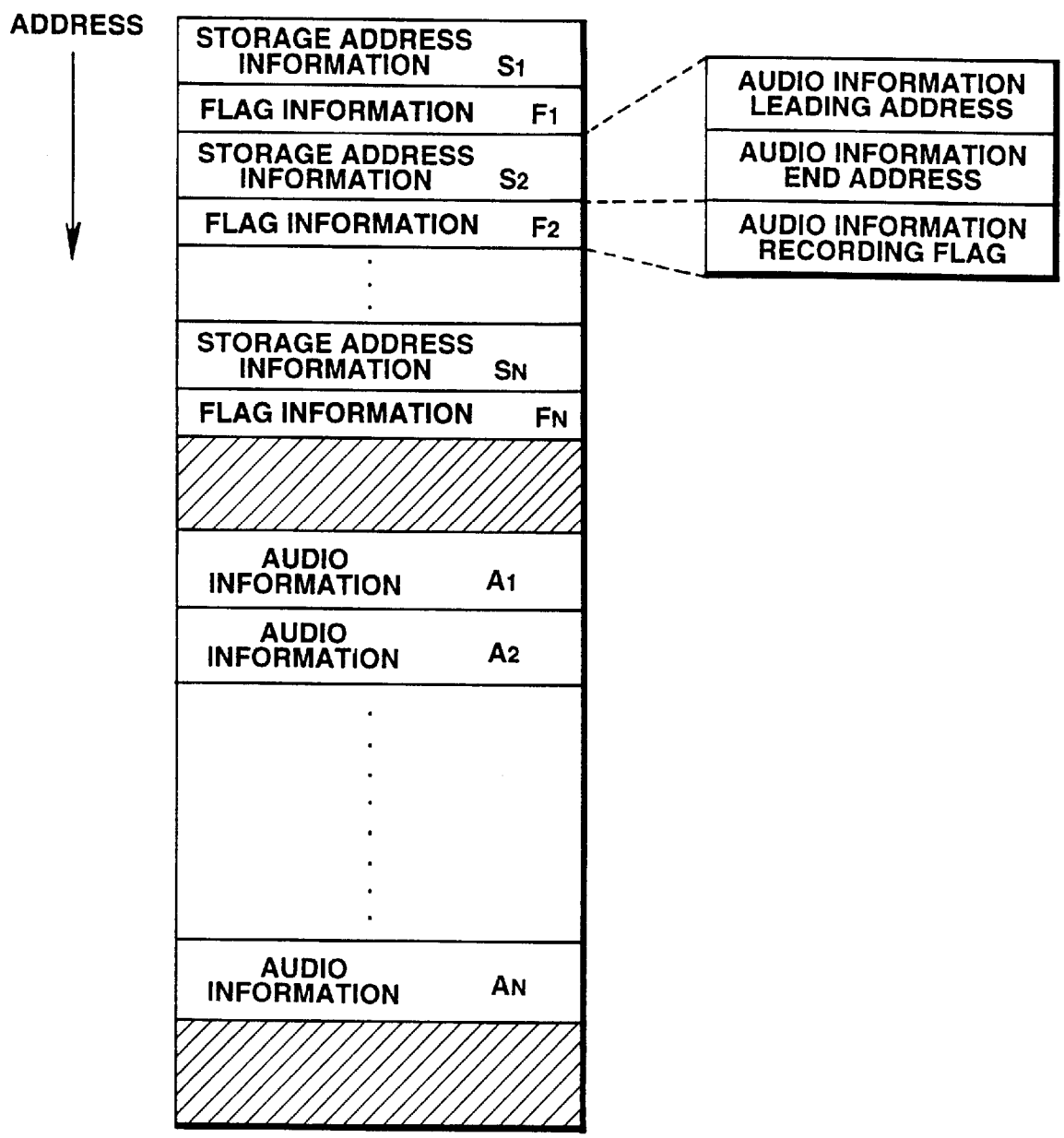
FIG. 8 is a view for explaining the content to be recorded into a primary recording medium used in the apparatus of the second embodiment.

In FIG. 8, the maximum values of the numbers of storage address information S and flag information F are determined in advance, and the storage area consisting of storage address information $S_1$~$S_N$ and flag information $F_1$~$F_N$ is caused to fall within a predetermined range. In the case of FIG. 8, storage address information S consists of an audio information leading address and an audio information end address, and flag information F consists of audio information recording flag.

In this embodiment, the first audio information $A_1$ is recorded immediately after the storage area. It is to be noted that, in carrying out division of information, e.g., a soundless (no sound) portion more than a predetermined time is detected, thus making it possible to divide the information with every soundless portion. Further, there may be employed a method of inserting in advance sound of a specific frequency every partition of information to detect it, thus to realize division of information.

After information has been recorded once into the primary recording medium 217 in this way, the device of this embodiment operates in a manner similar to the device of the first embodiment.

Namely, turning back to FIG. 7, a user can selectively reproduce the content of the primary recording medium 217 by using reproduction selector means 212. Select information from the reproduction selector means 212 based on selection by the user is sent to information reproducing means 218 through control means 213. This information reproducing means 218 selects and reproduces arbitrary audio information from the primary recording medium 217 on the basis of select information from the reproduction selector means 212. The audio information thus selected and reproduced is sent to sound generating means, e.g., an earphone or a speaker, etc. through terminal 220.

Further, a user of this information recording/reproducing device 40 specifies a portion that he wishes to obtain a backup copy for future use through information selector means 211 while listening to sound from the sound generating means. The specified information from the information selector means 211 is recorded into the primary recording medium 217 as flag information through control means 213 and information recording means 216.

In the information recording/reproducing device 40 of FIG. 7, information from the primary recording medium 217 is adapted to be also directly taken out from terminal 221.

Also in the above-described second embodiment, information received by the information receiving means 214 may be not only the above-described audio information but also a video signal, etc. Accordingly, such a video signal, etc. is recorded into the primary recording medium 217. In the case where reproduced information obtained from the primary recording medium 217 is, e.g., the text information or video information, that information can be displayed on the display means comprised of, e.g., a liquid crystal display, etc. On the other hand, in the case where reproduced information is, e.g., audio information, that information can be outputted to sound generating means, etc. in a manner similar to the above.

Further, as with the primary recording medium 20 of the first embodiment, various recording media may be used similarly to the first embodiment.

Particularly, it is preferable to use a semiconductor memory which can copy information at a high speed, is easy to be accessed at random, and is excellent in portability.

Figure 9:
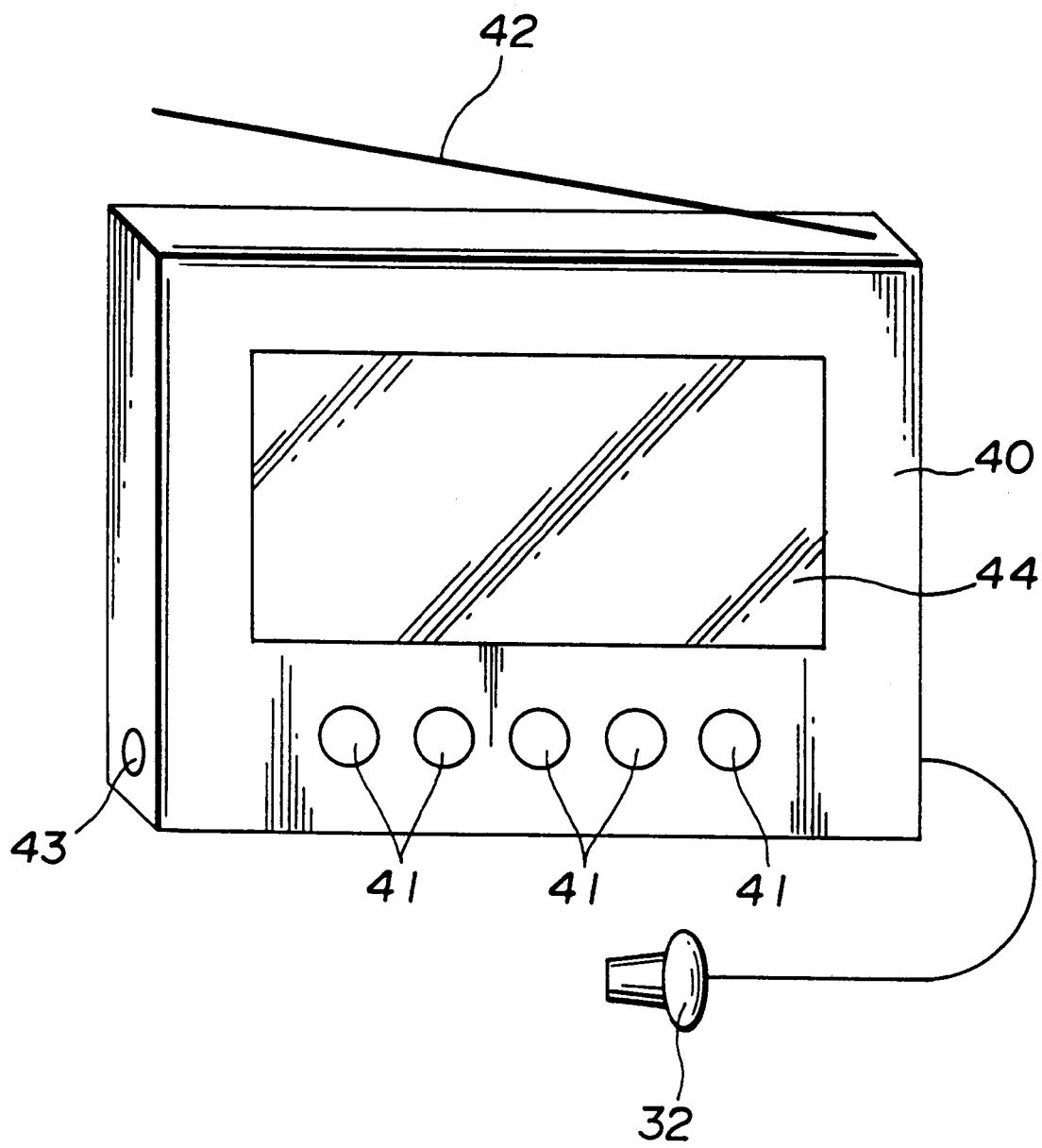
FIG. 9 is a schematic perspective view showing appearance of the information recording/reproducing device shown in FIG. 7.

FIG. 9 shows the outline of appearance of the above-described information recording/reproducing device 40 shown in FIG. 7.

The information recording/reproducing device 40 shown in FIG. 9 has, e.g., a function of a radio receiver as well. For this reason, an antenna 42 is disposed. Through this antenna 42, audio information, etc. is sent from the external. Further, in the information recording/reproducing device 40 shown in FIG. 9, there are also provided an information secondary recording/reproducing device connection terminal 43 connecting between the information recording/reproducing device 40 and the information secondary recording/reproducing device 60 shown in FIG. 6, display means 44 for display, and selector means 41 having both functions of reproduction selector means 212 and information selector means 211 of FIG. 7. In addition, an earphone 32 can be connected to the information recording/reproducing device 40. It is to be noted that, in the information recording/reproducing device 40 of FIG. 9, primary recording medium (primary recording medium 217 of FIG. 7) is mounted within the device 40.

As described above, in accordance with respective embodiments of this invention, a user of the information recording/reproducing device (portable recorder) of the information providing and collecting apparatus operates selector means for selecting information required for preservation at the time of reproduction of that information, or the like to transfer only information specified by that select information to the recording medium, thereby making it possible to easily preserve necessary information.

It is to be noted that, as means for inputting information into the primary recording medium used in this embodiment, a large number of means other than means employed in the above-described embodiments are conceivable. There is conceivable a method of recording information such as sound, etc. by using a recorder with information conversion function, e.g., a device adapted to apply A/D (analog/digital) conversion to an input signal from microphone to record a digital signal thus obtained. Various methods including such a method are included in this invention.

In addition, a recorder adapted for recording information into the primary recording medium is caused to have a clock function to also record information of date at which recording is carried out from a time (clock) recording, thereby making it possible to facilitate retrieval of the information content.

What is claimed is:

1. An information providing and collecting apparatus, comprising:

an information dividing circuit for dividing an input signal into information segments based on a break in information being carried by said input signal or a marker in said input signal generated by a user indicating an end of an information segment; and adding means for adding an information division signal in advance of each of said information segments.

2. The information providing and collecting apparatus as set forth in claim 1, wherein said information division signal is a signal of a specified frequency.

3. The information providing and collecting apparatus as set forth in claim 1, wherein information is transmitted by radio.

4. The information providing and collecting apparatus as set forth in claim 1, wherein information is transmitted by wire.

* * * * *